(12) United States Patent
Noguchi et al.

(10) Patent No.: US 9,786,342 B2
(45) Date of Patent: Oct. 10, 2017

(54) MEMORY CONTROL CIRCUIT AND CACHE MEMORY

(71) Applicant: KABUSHIKI KAISHA TOSHIBA, Tokyo (JP)

(72) Inventors: Hiroki Noguchi, Kanagawa (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/059,842

(22) Filed: Mar. 3, 2016

(65) Prior Publication Data

US 2016/0189761 A1    Jun. 30, 2016

Related U.S. Application Data

(63) Continuation of application No. PCT/JP2014/073634, filed on Sep. 8, 2014.

(30) Foreign Application Priority Data

Sep. 6, 2013    (JP) .................................. 2013-185695

(51) Int. Cl.
*G11C 11/00* (2006.01)
*G11C 11/16* (2006.01)
(Continued)

(52) U.S. Cl.
CPC ...... *G11C 11/1659* (2013.01); *G06F 12/0862* (2013.01); *G06F 12/0897* (2013.01);
(Continued)

(58) Field of Classification Search
CPC ............ G11C 2211/5614; G11C 11/02; G11C 15/02; G11C 11/1659; G11C 11/005; G11C 11/1673
(Continued)

(56) References Cited

U.S. PATENT DOCUMENTS 4,953,164 A * 8/1990 Asakura .............. G06F 11/1064
714/754
5,261,066 A    11/1993 Jouppi et al.
(Continued)

FOREIGN PATENT DOCUMENTS

JP    5-196695    8/1993
JP    11-167520    6/1999
(Continued)

OTHER PUBLICATIONS

International Search Report issued by the Japanese Patent Office and Written Opinion of the International Searching Authority in International Application No. PCT/JP2014/073634, mailed Nov. 4, 2014.
(Continued)

*Primary Examiner* — Huan Hoang
(74) *Attorney, Agent, or Firm* — Finnegan, Henderson, Farabow, Garrett & Dunner, L.L.P.

(57) ABSTRACT

A memory control circuit to control a first memory comprising a plurality of MRAM cells, each MRAM cell including of a magnetoresistive element to store data, has a second memory, when there is a read request to a first address of the first memory, to read data of a second address different from the first address, from the first memory and store the read data, a controller to control access to the first memory and the second memory, a capacitor connected in series to the magnetoresistive element, and a sense amplifier to sense a logic of the data from a voltage between both electrodes of the capacitor, the voltage varying in accordance with a current flowing through the magnetoresistive element.

20 Claims, 9 Drawing Sheets

(51) Int. Cl.
   *G06F 12/0862* (2016.01)
   *G06F 12/0897* (2016.01)
(52) U.S. Cl.
   CPC ........ *G11C 11/005* (2013.01); *G11C 11/1673* (2013.01); *G06F 2212/222* (2013.01); *Y02B 60/1225* (2013.01)
(58) Field of Classification Search
   USPC .............................................. 365/158, 49.1
   See application file for complete search history.

(56) References Cited

U.S. PATENT DOCUMENTS

| | | | |
|---|---|---|---|
| 6,173,392 | B1 | 1/2001 | Shinozaki |
| 6,317,351 | B2 | 11/2001 | Choi et al. |
| 6,404,673 | B1 | 6/2002 | Matsui |
| 6,415,355 | B1 | 7/2002 | Hiroguji |
| 8,472,243 | B2 | 6/2013 | Higo et al. |
| 2001/0026465 | A1* | 10/2001 | Choi .................. G06F 12/0864 365/49.1 |
| 2005/0086435 | A1 | 4/2005 | Todoroki |
| 2011/0222334 | A1 | 9/2011 | Aoki |
| 2012/0246412 | A1 | 9/2012 | Nomura et al. |

FOREIGN PATENT DOCUMENTS

| | | |
|---|---|---|
| JP | 11-259361 | 9/1999 |
| JP | 11-327796 | 11/1999 |
| JP | 2001-101075 | 4/2001 |
| JP | 2001-134439 | 5/2001 |
| JP | 2001-273193 A | 10/2001 |
| JP | 2001-331793 | 11/2001 |
| JP | 2002-42458 A | 2/2002 |
| JP | 2002-163150 | 6/2002 |
| JP | 2002-215456 A | 8/2002 |
| JP | 2005-84999 | 3/2005 |
| JP | 2011-192345 | 9/2011 |
| JP | 2012-14787 A | 1/2012 |
| JP | 2012-203487 | 10/2012 |

OTHER PUBLICATIONS

International Preliminary Report on Patentability issued by the Japanese Patent Office on Mar. 8, 2016, in International Application No. PCT/JP2014/073634.

* cited by examiner

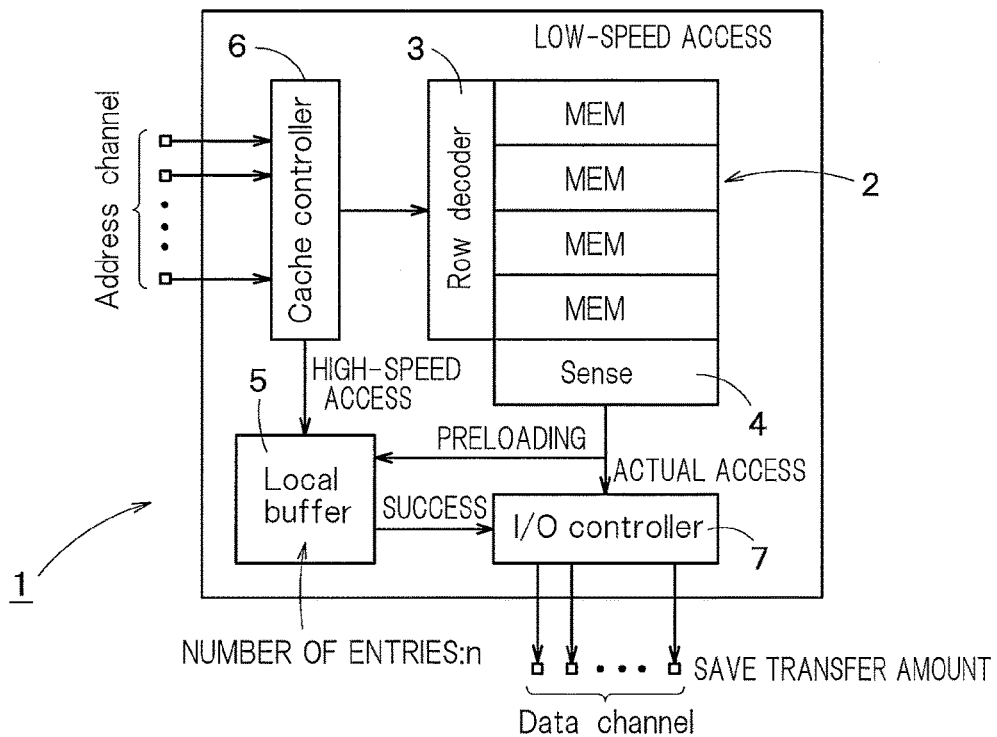
F I G. 1
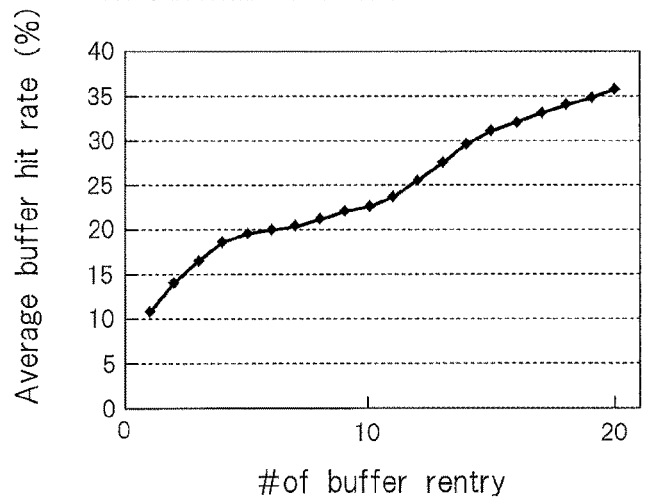
RELATIONSHIP BETWEEN NUMBER OF ENTRIES AND HIT RATE
F I G. 2

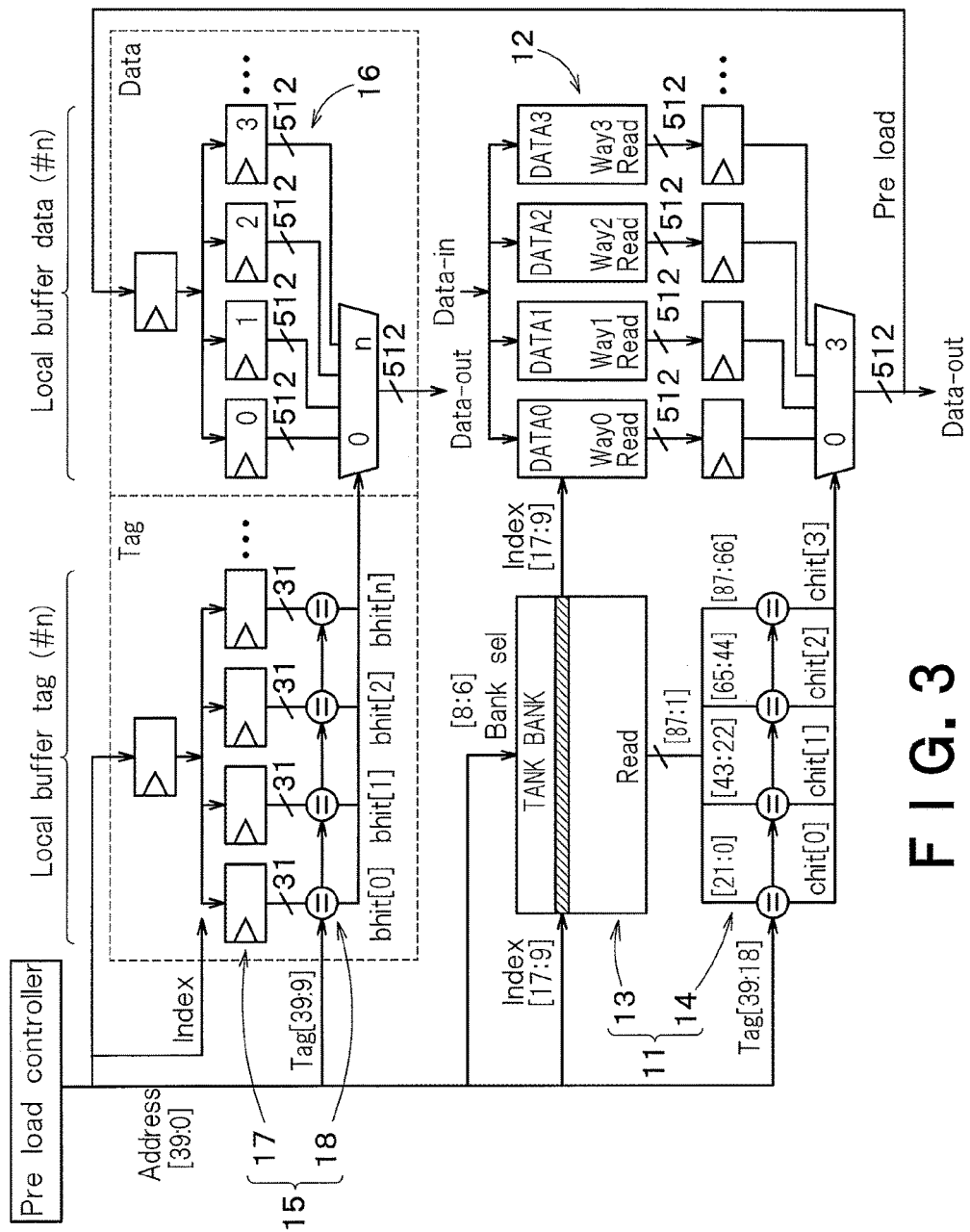
F I G. 3

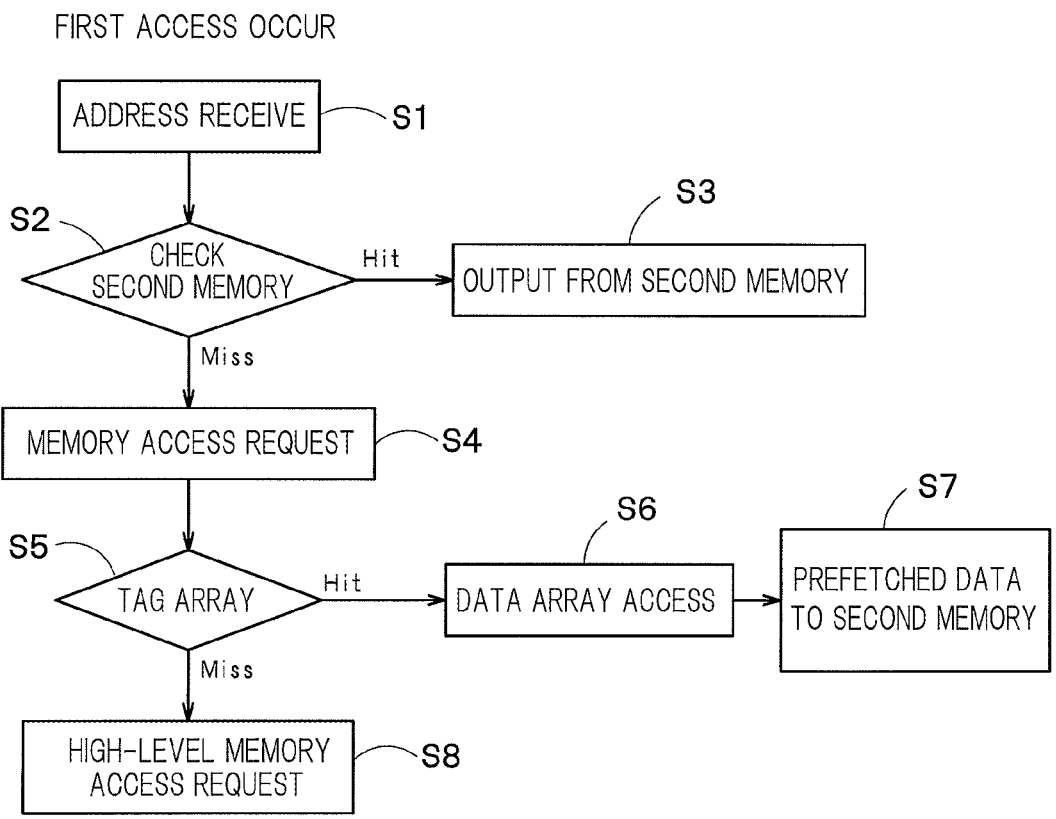
F I G. 4

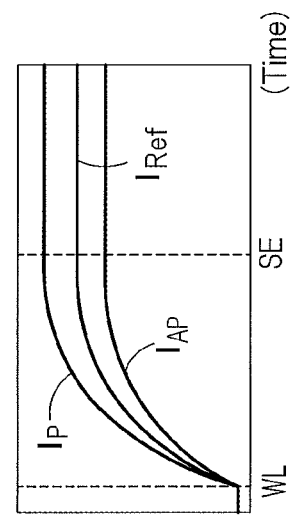
F I G. 5A
Conventional read scheme
Current-sensing scheme
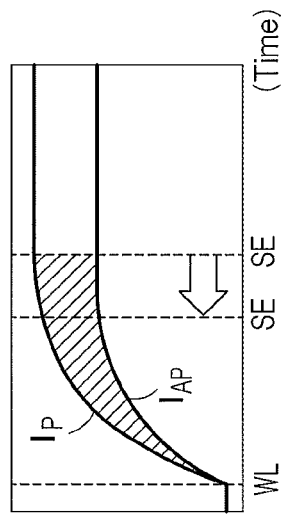
F I G. 5B
Timing of $I_{Ref}$ is widely varied
Current difference is very small
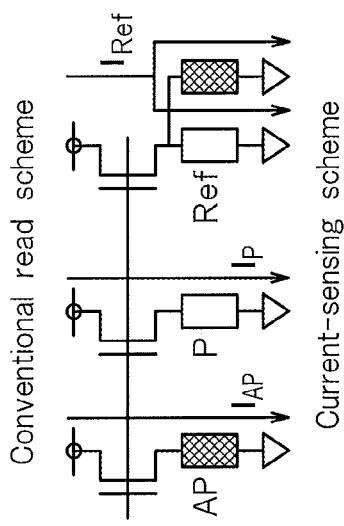
F I G. 5C
Proposed read scheme
Voltage-sensing scheme
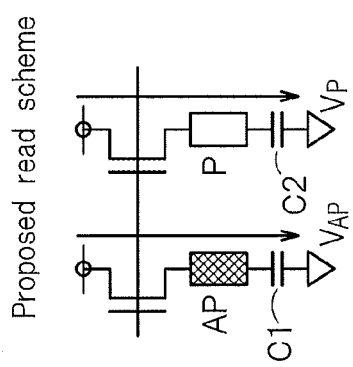
F I G. 5D
Complementary cell Currents
Read currents are accumulated F I G. 6A
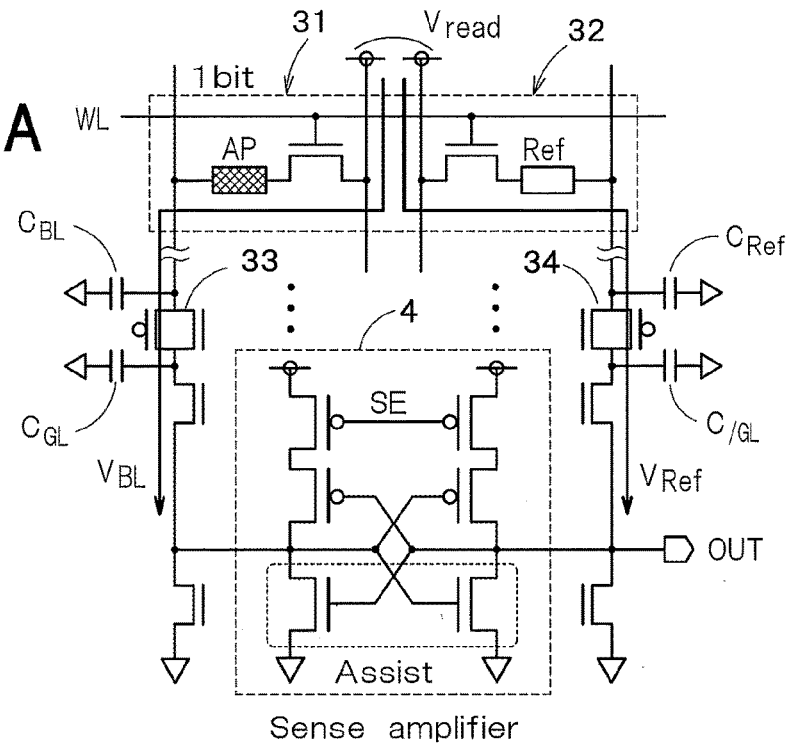
F I G. 6B
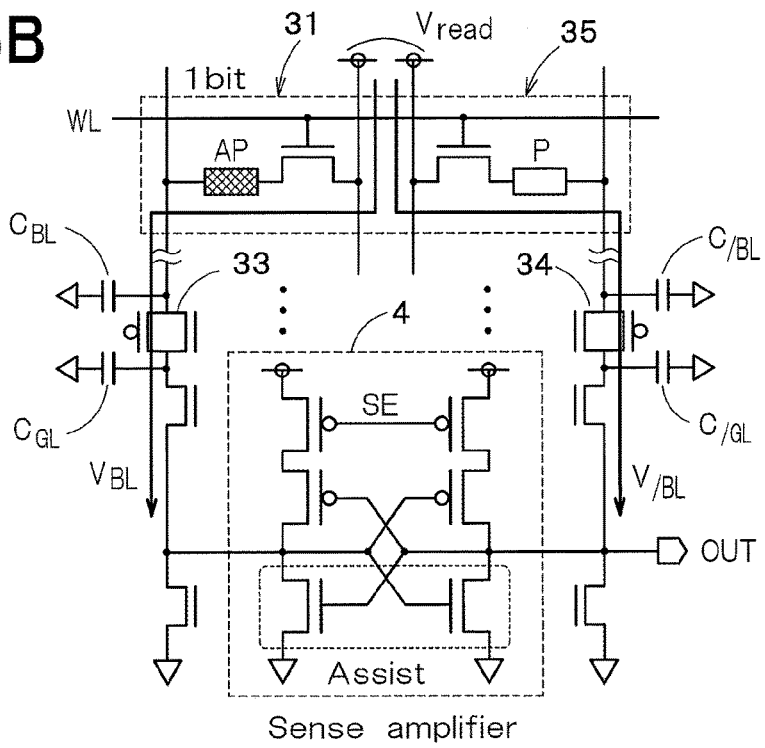

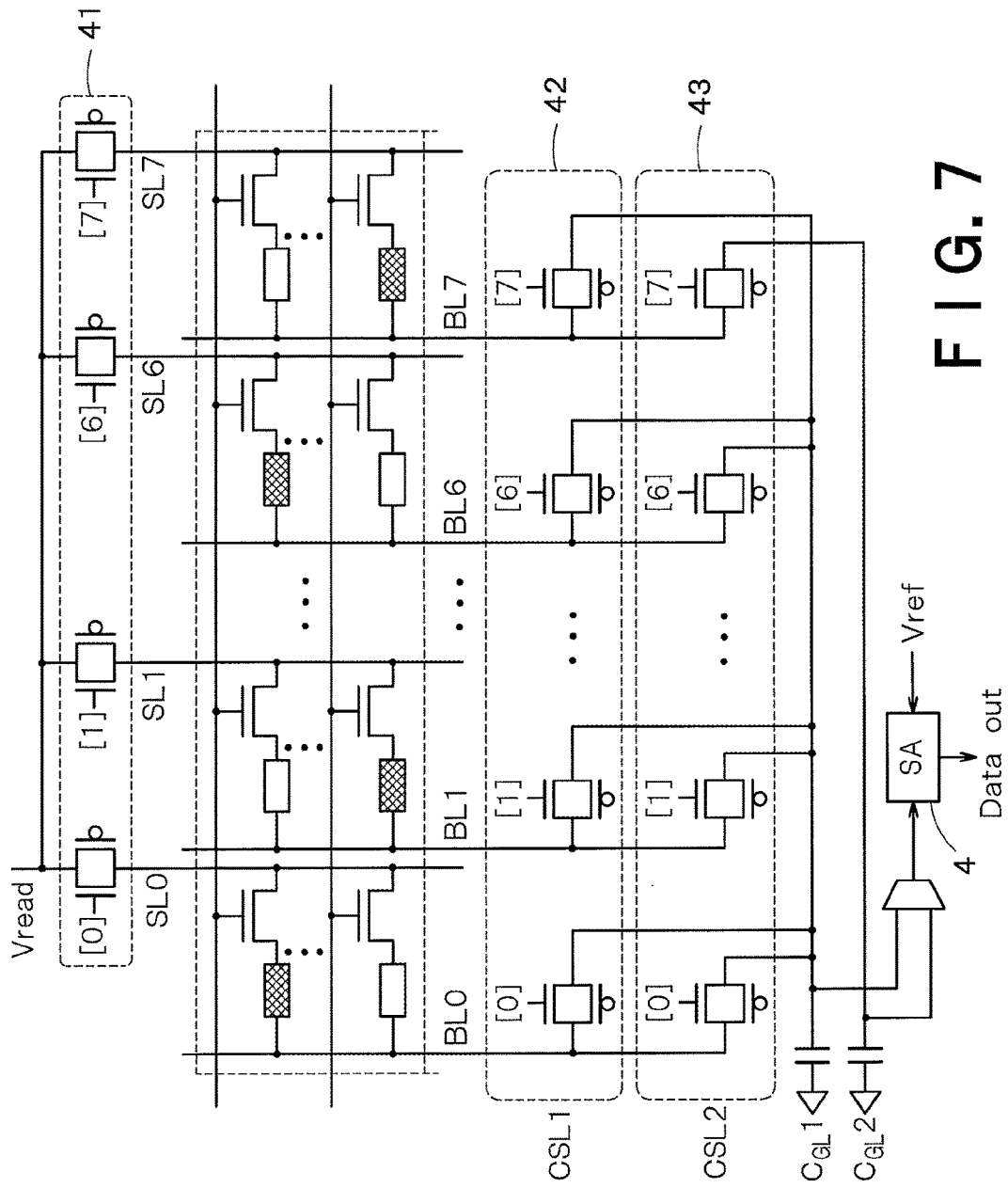
F I G. 7

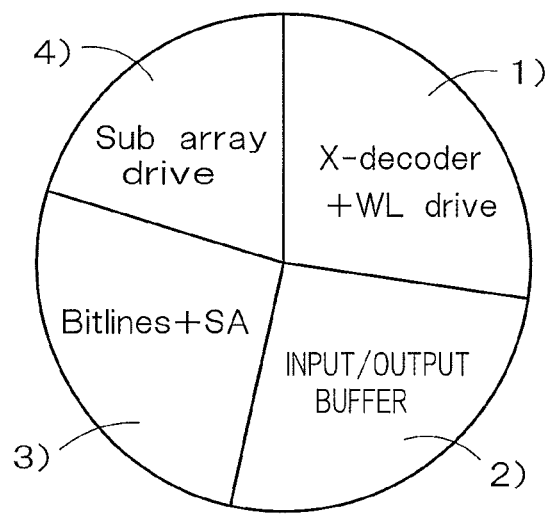
F I G. 10
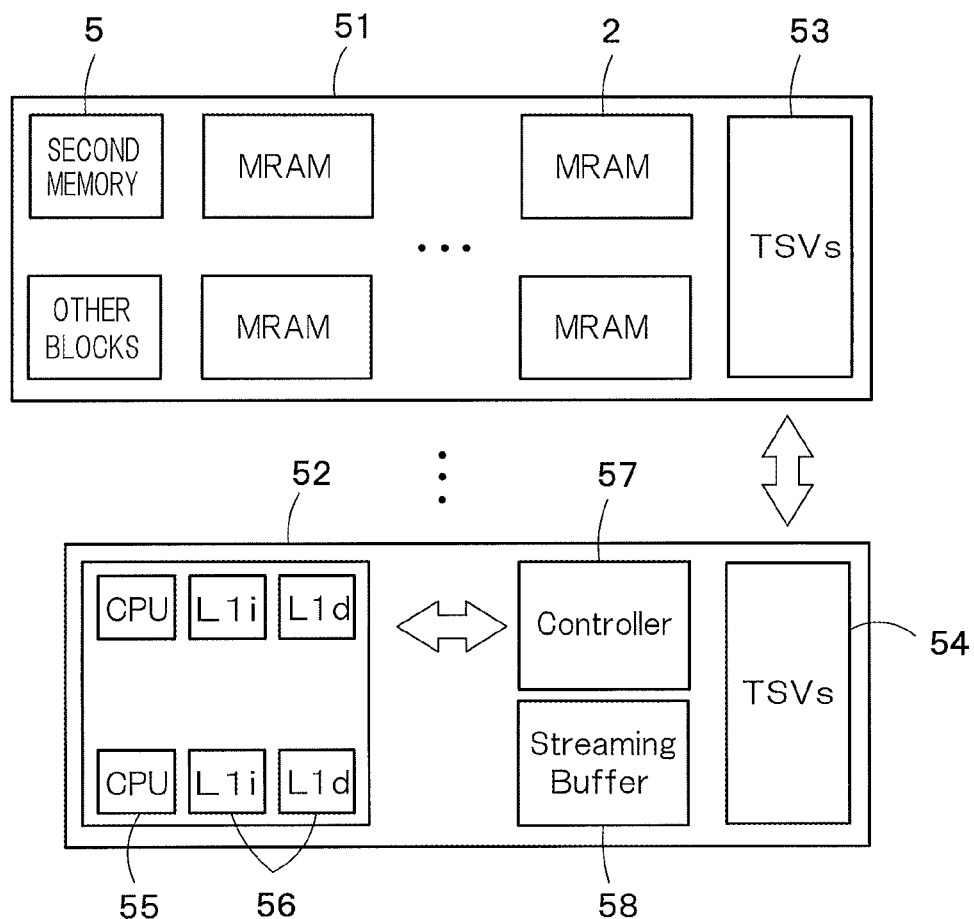
F I G. 11

US 9,786,342 B2

MEMORY CONTROL CIRCUIT AND CACHE MEMORY

CROSS REFERENCE TO RELATED APPLICATIONS

This application is based upon and claims the benefit of priority from the prior Japanese Patent Application No. 2013-185695, filed on Sep. 6, 2013, the entire contents of which are incorporated herein by reference.

FIELD

Embodiments of the present invention relate to a memory control circuit for controlling a cache memory and a cache memory having a built-in memory control circuit.

BACKGROUND

Prefetching and a row buffer are known as a technique to cover up latency in data loading from a processor to a memory (such as a main memory) of low access speed, or large latency.

Prefetching is a technique to predict data to be required in future and to transfer in advance the data between different layers. When the prediction of data to be required in future by prefetching hits, a data transfer time is shortened, so that a data waiting time is shortened for a processor.

The row buffer, also referred to as a history buffer, is a technique to store most recently accessed data in a buffer so as to realize high-speed data access when access is made to the same address as the stored data.

In prefetching, data transfer is performed in advance. Thus, a large overhead is caused if prediction by prefetching fails. Prefetching is a technique to cover up latency by transferring data to an upper layer, with no effects of latency cover-up in the same layer. The row buffer is effective for accessing data accessed in the past whereas not effective for accessing a new address.

BRIEF DESCRIPTION OF DRAWINGS

FIG. 1 is a block diagram schematically showing the configuration of a cache memory 1 according to an embodiment;

FIG. 2 is graph showing the relationship in a local buffer 5 between the number of entries and an address hit rate;

FIG. 3 is a block diagram showing an example of the internal structures of a memory cell array 2 and a local buffer 5 in the cache memory 1 of FIG. 1;

FIG. 4 is a flow chart showing an example of the operation of a controller 6;

FIG. 5A is a diagram explaining an outline current-sensing scheme, FIG. 5B is a diagram showing current waveforms flowing through magnetoresistive elements AP and P in the current-sensing scheme, FIG. 5C is a diagram explaining an outline voltage-sensing scheme, and FIG. 5D is a diagram showing current waveforms flowing through the magnetoresistive elements AP and P in the voltage-sensing scheme;

FIG. 6A is a circuit diagram showing an example of a 1T-1R type and FIG. 6B is a circuit diagram showing an example of a 2T-2R type;

FIG. 7 is a peripheral circuit diagram of bit lines, a column selector circuit, and global capacitance in the 1T-1R type;

FIG. 10 is a graph showing a breakdown of power consumption for each read request by a processor; and FIG. 11 is a schematic layout diagram showing an example of three-dimensional integration.

DETAILED DESCRIPTION

Figure 8:
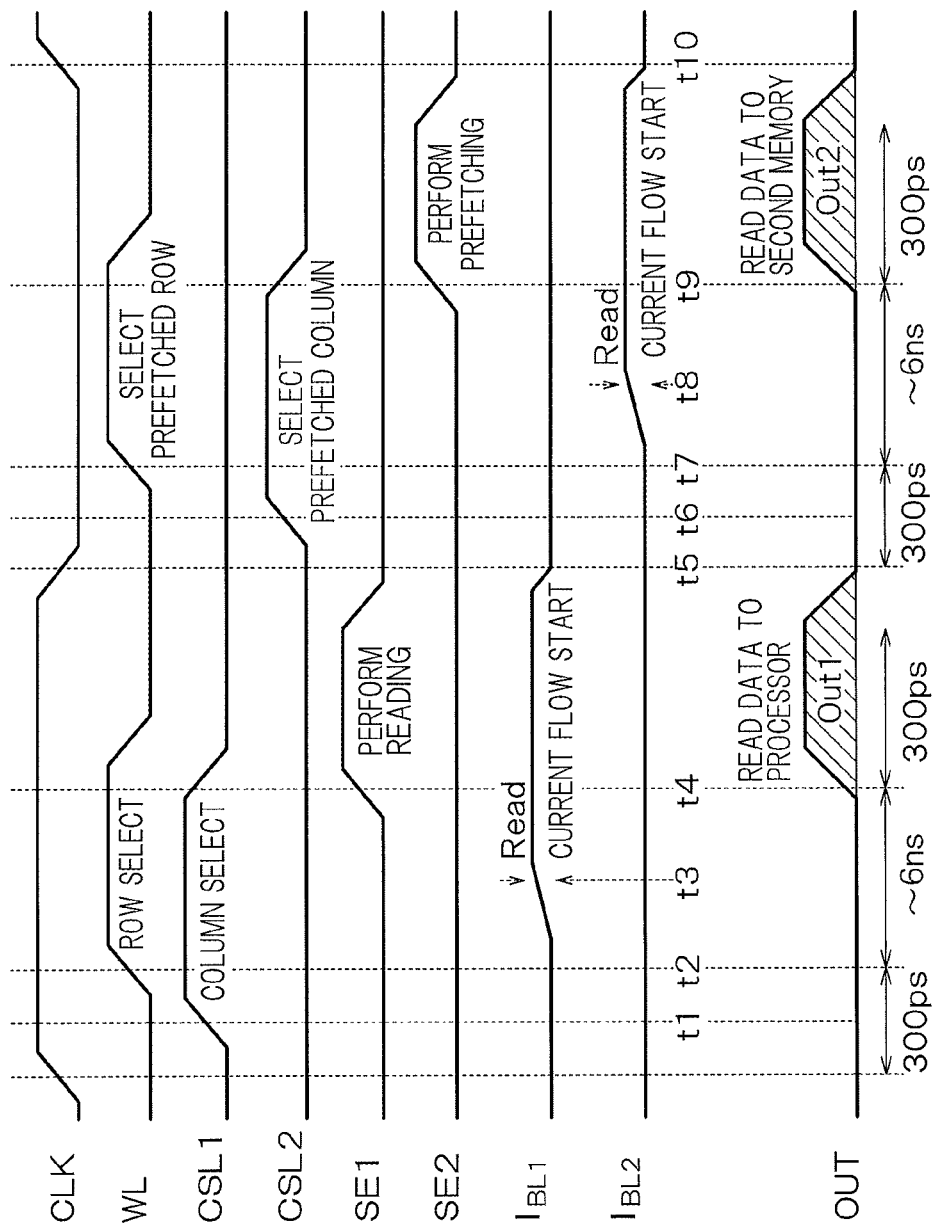
FIG. 8 is a timing chart for reading from the cache memory 1 using the circuit of FIG. 7 and prefetching using the local buffer 5.

A problem to be solved by the present invention is to provide a memory control circuit and a cache memory, capable of quick response to an access request.

The present embodiment provides a memory control circuit to control a first memory comprising a plurality of MRAM (Magnetoresistive Random Access Memory) cells, each MRAM cell including of a magnetoresistive element to store data, comprising:

a second memory, when there is a read request to a first address of the first memory, to read data of a second address different from the first address, from the first memory and store the read data;

a controller to control access to the first memory and the second memory;

a capacitor connected in series to the magnetoresistive element; and a sense amplifier to sense a logic of the data from a voltage between both electrodes of the capacitor, the voltage varying in accordance with a current flowing through the magnetoresistive element, wherein the second memory has a smaller capacity than the first memory and is accessible at a higher speed than the first memory, and stores a part of data stored in the first memory.

Hereinafter, embodiments of the present invention will be explained with reference to the drawings.

FIG. 1 is a block diagram schematically showing the configuration of a cache memory 1 according to an embodiment. The cache memory 1 of FIG. 1 is provided with a memory cell array (first memory, cache array) 2, a row decoder 3, a sense amplifier 4, a local buffer (second memory) 5, a cache controller (controller) 6, and an I/O controller 7. In the cache memory 1, at least the local buffer 5 and the cache controller 6 correspond to a memory control circuit.

The memory cell array 2 has memory cells, each having a higher access speed than a main memory (not shown), arranged vertically and horizontally. The present embodiment uses non-volatile memories as the memory cells. The reason why SRAMs (Static RAMs) are not used is that the SRAMs consume a lot of standby power, and hence not suitable for mobile information terminals that are required to consume a small amount of power. Moreover, the SRAMs have a large area for each bit, so that when the memory capacity is increased, the consumption power is increased and the operation speed is reduced. The reason why the operation speed is reduced when the memory cell array 2 has a larger area is that wirings become longer which causes delay in the wirings and a longer word-line drive time, resulting in difficulty in high-speed reading. Moreover, due to increase in wiring capacity, the leakage current is increased to increase the consumption power.

The present embodiment intends to use an MRAM (Magnetoresistive RAM) among non-volatile memories. Compared to other non-volatile memories such as NAND flash memories, the MRAM has features of high rewriting durability, high operation speed, and ease of high integration.

The MRAM has a small area for each bit so that the memory capacity about 10 times as large as SRAM cells in the same circuit area as the SRAM cells. Nevertheless, since the MRAM has a mechanism for retaining data using minute resistance change, the MRAM is slow in reading time compared to the SRAM. Therefore, a processor needs a long latency period from an access request to data acquisition, which may cause that the processor stalls.

It is generally difficult to achieve both of large capacity and high speed. There is a trade-off between the memory capacity and the operation speed, that is, the larger the capacity, the lower the operation speed, whereas the higher the operation speed, the smaller the capacity. In the present embodiment, the local buffer 5 is provided to achieve both of large capacity and high speed.

The local buffer 5 has memory cells (for example, SRAMs) having a higher speed than the MRAM cells. It is a precondition that the local buffer 5 has a smaller memory capacity than the cache memory 1.

The local buffer 5 may have the same cell structure as the memory cell array 2. Even with the same cell structure as the memory cell array 2, the local buffer 5 has an extremely smaller memory capacity than the memory cell array 2, so that a wiring delay also becomes smaller. Moreover, the local buffer 5 has a small number of memory cells connected to one word line, and thus having a high word-line driving performance. Therefore, even if, MRAM cells, or the like, of the same cell structure are used for both of the local buffer 5 and the memory cell array 2, the local buffer 5 can operate at a higher speed than the memory cell array 2.

The local buffer 5 is provided in the same memory layer as the cache memory 1. Therefore, when the processor designates a specific address to make an access (read) request to the cache memory 1, an address different from the specific address is newly generated to read data from the cache memory 1. The read data is stored in the local buffer 5. The different address is, for example, an address next to the address for which the processor has made a read request. Although, the unit of data to be read with one address is not limited in particular, it is 512 bits, the same unit as a cache line, for example.

The cache controller 6 issues an address for accessing the local buffer 5. The cache controller 6 generates a new address by, for example, incrementing or decrementing the address for which the processor has made a read request.

The newly generated address is an address for which the processor is supposed to make an access request from now on, which is an address to be prefetched. The present inventors made an evaluation with SPEC CPU2006 that is a computer hardware performance-evaluation software suit offered by Standard Performance Evaluation (SPEC). According to the evaluation, access speed-up was achieved for 10% to 30% of the total access to addresses newly generated by address increment.

FIG. 2 is graph showing the relationship between the memory capacity of the local buffer 5, namely, the number of entries, and an address hit rate. The graph shows the result of evaluation with the SPEC CPU2006 mentioned above. As shown in FIG. 2, it is confirmed that speed-up of the access has been achieved at about 20%, or for one in five times of access in the case where there are five entries in the local buffer 5.

The local buffer 5 is filled with data soon due to the limited memory capacity, or the limited number of entries. It is desirable that, once the local buffer 5 is filled with data, the data are deleted starting from the oldest one to be replaced with new data. Data stored in the local buffer 5 have also been stored in the cache memory 1. Therefore, no problem occurs in operation even if data are deleted from the local buffer 5. However, if the number of entries in the local buffer 5 is increased, the wiring length is increased and the word-line driving performance is decreased to lower the access speed. Therefore, it is not desirable to increase the number of entries too much in the local buffer 5.

Explanation is made for five entries in the local buffer 5, as an example. In this case, five pieces of data prefetched at the past five times of access have been stored in the local buffer 5. It is supposed that, when there is an access request from the processor, an access-requested address matches one of five addresses that correspond to the five pieces of data in the local buffer 5. In this case, prefetching is successful and hence data is rapidly read from the local buffer 5.

If the access-requested address does not match any address corresponding to the data in the local buffer 5, prefetching is in failure and hence data is read from the cache memory 1. In this case, based on the access-request address, an address which is supposed to be accessed in future is predicted to prefetch the corresponding data from the cache memory 1 and store this data in the local buffer 5, with deletion of the oldest data in the local buffer 5.

There is a variety of techniques to predict an address from an access-requested address, such as an address prediction technique based on history information on access-requested addresses, besides the technique based on the address increment or decrement described above. For example, an FPGA (Field Programmable Gate Array) may be used for the cache controller 6 so that an algorithm for determining an address to be prefetched can be reprogrammed later.

One or a plurality of addresses may be prefetched. The graph of FIG. 2 shows an example in which incremented addresses are prefetched one by one and stored in the local buffer 5. When prefetching is successful, the latency in the cache memory 1 can be drastically reduced to significantly improve processor instruction-execution efficiency. Moreover, by using a non-volatile memory for the cache memory 1, it is achieved to improve a primal hit rate and, in addition, a hit rate by the local buffer 5, thus achieving a drastic improvement in memory access speed, compared to a cache memory 1 of conventional SRAMs.

When data corresponding to an address to which the processor has made a read request is not stored in the cache memory 1, namely, when a cache miss occurs, prefetching is not performed and an access request is issued to a cache memory or main memory that is lower in level (high-level memory, hereinafter) than the cache memory 1.

When data corresponding to an address to which the processor has made a read request is read from the cache memory 1 and a prefetched address is issued, data corresponding to the prefetched address may have not been stored in the cache memory 1. In this case, an access request to a high-level memory is not issued so that prefetching is not performed. This is because when accessing the high-level memory for prefetching, it takes time to acquire data, which may cause processing delay in the processor. When accessing the high-level memory can be done at high speeds, an access request may be issued to the high-level memory.

The cache controller 6 may not always perform address prefetching control using the local buffer 5. when there is a lot of access to the cache memory 1, the cache controller 6 may, for example, process firstly an access-requested address without address prefetching, namely, with no data addition to the local buffer 5.

A hit-rate monitoring counter may be provided in the local buffer 5. In this case, for example, the cache controller 6 detects a ratio (hit rate) of access times to the cache memory 1 to prefetching hit times. If the hit rate is lower than a predetermined threshold value (for example, consecutive misses of 10 times), the cache controller 6 temporarily halts or suspends address prefetching so as not to add data to the local buffer 5.

This is because, an access pattern to the cache memory 1 becomes unstable at the time of OS-controlled program or process switching. When the access pattern is unstable, prefetching may be temporary halted or suspended to restrict unnecessary power consumption.

FIG. 3 is a block diagram showing an example of the internal structures of the memory cell array 2 and the local buffer 5 in the cache memory 1 of FIG. 1.

As shown in FIG. 3, the memory cell array 2 has a first tag unit 11 and a first data unit 12. The first tag unit 11 has a first address storage 13 that stores an address corresponding to data in the cache memory 1 and a first tag comparator 14 that compares an access-request address and an address of data in the cache memory 1 to determine whether both addresses match each other. The first data unit 12 stores data in a plurality of ways, for example. Data to be stored in the first data unit 12 is data stored in the high-level memory (low-order memory) of the cache memory 1 or data to be stored in the high-level memory in future.

The local buffer 5, likewise, has a second tag unit 15 and a second data unit 16. The second tag unit 15 has a second address storage 17 that stores an address corresponding to data in the local buffer 5 and a second tag comparator 18 that compares an access-request address and an address of data in the local buffer 5 to determine whether both addresses match each other. Data to be stored in the second data unit 16 is data stored in the cache memory 1.

In FIG. 3, when the processor designates an address [39:18] to perform a read request, upper bits [39:18] of the address are input to the first tag comparator 14 in the first tag unit 11 to be compared with an address stored in the first address storage 13 in the first tag unit 11 to determine whether the addresses match each other. There are four ways in the first data unit 12 in the example of FIG. 3. The first tag comparator 14 makes comparison with an address of data stored in each way. If there is address match, data in the way having the address match is read from the memory cell array 2. In the example of FIG. 3, data in each way has 512 bits so that 512-bit data is output for each address.

The access-request address is also input to the second tag unit 15 in the local buffer 5 and compared by the second tag comparator 18 with an address corresponding to data in the local buffer 5. If there is a match between the addresses, the corresponding data in the local buffer 5 is read therefrom.

The local buffer 5 has a higher operation speed than the memory cell array 2 in the cache memory 1. Therefore, the data read from the local buffer 5 is transferred to the processor prior to the data read from the memory cell array 2.

If the access-requested address does not match the address in the local buffer 5, or there is no hit in the local buffer 5, for example, data of an address next to the access-requested address is read from the cache memory 1 and stored in the local buffer 5.

FIG. 4 is a flow chart showing an example of the operation of the controller 6. Firstly, an access request from the processor is received (Step S1). The access request in this case is a read request to an address.

Subsequently, it is determined whether data of the address has been stored in the local buffer 5 (Step S2). If stored, it is determined that there is a hit, and hence the corresponding data is read from the local buffer 5 and transferred to the processor (Step S3). This achieves data reading at higher speeds than data reading from the cache memory 1.

If it is determined in the above-mentioned Step S2 that the data is not stored in the local buffer 5, an access request is made to the memory cell array 2 in the cache memory 1 (Step S4). Subsequently, it is determined whether the access-requested address has a match in the first tag comparator 14 (Step S5). If there is a match, it is determined that there is a hit in the memory cell array 2, and hence the corresponding data is read from the memory cell array 2 (Step S6). Then, data of an address, for example, next to the access-requested address is read from the memory cell array 2 and stored in the local buffer 5 (Step S7).

If it is determined in the above-mentioned Step S5 that there is no match, an access request is made to the high-level memory (low-order memory) (Step S8).

In the case where the memory cell array 2 has MRAM cells, magnetoresistive elements in the MRAM cells change their resistance values depending on whether data to be stored is 0 or 1. There are two schemes for detecting a resistance value of a magnetoresistive element. One scheme is a current-sensing scheme for detecting a current flowing through a magnetoresistive element. The other scheme is a voltage-sensing scheme for detecting a voltage at one end of a capacitor connected to a magnetoresistive element.

FIG. 5A is a diagram explaining an outline current-sensing scheme. FIG. 5B is a diagram showing current waveforms flowing through magnetoresistive elements AP and P in the current-sensing scheme. FIG. 5C is a diagram explaining an outline voltage-sensing scheme. FIG. 5D is a diagram showing current waveforms flowing through the magnetoresistive elements AP and P in the voltage-sensing scheme. In these diagrams, one of the magnetoresistive elements AP and P is high resistive and the other low resistive.

As understood from comparison of FIG. 5B and FIG. 5D, in the voltage-sensing scheme, charges in accordance with the currents flowing through the magnetoresistive elements AP and P are stored in the capacitors C1 and C2. Electric charges stored in the capacitors C1 and C2 vary due to the resistance values of the magnetoresistive elements AP and P, and a voltage at one end of each of the capacitors C1 and C2 varies accordingly. Therefore, by sensing the voltage at one end of each of the capacitors C1 and C2, the resistance value of each of the magnetoresistive elements AP and P, respectively, can be obtained. The sense amplifier 4 reads the voltage at one end of the capacitor C1 and then that at one end of the capacitor C2 to correctly sense each data bit value. The capacitors C1 and C2 include at least one of a capacitor intentionally produced using a conductive material and a capacitor indirectly formed with parasitic capacitance, wiring capacitance, etc. Therefore, for example, it is possible to use wiring capacitance without intentionally produced capacitors.

In the case of the current-sensing scheme, it is required to sense currents which instantaneously flow through the magnetoresistive elements AP and P. Therefore, as shown in FIG. 5B, the difference between the currents flowing through the two magnetoresistive elements AP and P is small, and hence a read margin is small. On the contrary, in the case of the voltage-sensing scheme, a result of accumulation of currents at the capacitors C1 and C2 is read as a voltage, and hence a read margin is larger as shown in FIG. 5D, which achieves more reliable data reading.

There are a 1T-1R type and a 2T-2R type for the structure of the memory cell array 2 including MRAM cells. FIG. 6A is a circuit diagram showing an example of the 1T-1R type. FIG. 6B is a circuit diagram showing an example of the 2T-2R type.

The circuit of FIG. 6A includes an MRAM cell 31 having a magnetoresistive element AP, a reference cell 32 having a reference resistor Ref, a transfer gate 33 provided on a bit line through which a current from the MRAM cell 31 flows, local capacitance (first capacitance) $C_{BL}$ connected to one end of the transfer gate 33, global capacitance (second capacitance) $C_{GL}$ connected to the other end of the transfer gate 33, a transfer gate 34 provided on a reference bit line through which a current from the reference cell 32 flows, local capacitance $C_{REF}$ connected to one end of the transfer gate 34, global capacitance $C_{/GL}$ connected to the other end of the transfer gate 34, and a sense amplifier 4 connected to the bit line and the reference bit line.

A circuit of FIG. 6B includes a pair of MRAM cells 31 and 35 respectively having magnetoresistive elements AP and P having different resistance values, a pair of transfer gates 33 and 34 respectively provided on a pair of bit lines through which currents from the MRAM cells 31 and 35 flow, respectively, a pair of local capacitance $C_{BL}$ and $C_{/BL}$ each connected to one end of the corresponding one of the paired transfer gates 33 and 34, a pair of global capacitance $C_{GL}$ and $C_{/GL}$ each connected to the other end of the corresponding one of the paired transfer gates 33 and 34, and a sense amplifier 4 connected to the pair of bit lines.

In the 1T-1R type of FIG. 6A, data 0 and 1 are determined by comparing a voltage at one end of a capacitor that is a composite of the local and global capacitance $C_{BL}$ and $C_{GL}$ that store charges in accordance with a current flowing through the magnetoresistive element AP in the MRAM cell 31, and a voltage at one end of a capacitor that is a composite of the local and global capacitance $C_{REF}$ and $C_{/GL}$ that store charges in accordance with a current flowing through the reference resistor Ref in the reference cell 32. The reference resistor Ref has a resistance value between a high and a low resistance value that can be taken by the magnetoresistive element AP. Therefore, the data 0 or 1 is determined according to whether the resistance value of the magnetoresistive element AP is larger or smaller than that of the reference resistor Ref.

In the 2T-2R type of FIG. 6B, the magnetoresistive elements AP and P respectively in the MRAM cells 31 and 35 and connected to a pair of bit lines, respectively, are set to have high and low resistance values or vice versa. Data 0 and 1 are determined by comparing a voltage at one end of a capacitor that stores charges in accordance with a current flowing through the magnetoresistive element AP and a voltage at one end of a capacitor that stores charges in accordance with a current flowing through the magnetoresistive element P. As described above, in the 2T-2R type, since data is read in a differential manner using a pair of bit lines, it is achieved to read data at higher speeds than in the case of the 1T-1R type.

The capacitors C1 and C2 shown in FIG. 5C have capacitance that is a composite of the local and global capacitance $C_{BL}$ and $C_{GL}$, and the local and global capacitance $C_{/BL}$ and $C_{/GL}$, respectively, shown in FIGS. 6A and 6B. Each of the local capacitance $C_{BL}$ and $C_{/BL}$ is a composite of parasitic capacitance and each capacitance generated on each bit line. In contrast, the global capacitance $C_{GL}$ and $C_{/GL}$ are shared by a plurality of bit lines, although FIGS. 6A and 6B show as if the capacitance were provided for each bit line.

FIG. 7 is a peripheral circuit diagram of bit lines, a column selector circuit, and global capacitance in the 1T-1R type, showing a circuit structure for one byte. The circuit of FIG. 7 has a transfer gate group 41 for selecting a source line and transfer gate groups 42 and 43 for selecting bit lines, the groups corresponding to the column selector circuit. The transfer gate groups 42 and 43 for selecting a bit line include the transfer gate group (a first bit line selector) 42 for selecting a bit line corresponding to an address to which a processor has made a read request and the transfer gate group (a second bit line selector) 43 for selecting a bit line corresponding to an address to be prefetched. Global capacitance $C_{GL}$ and $C_{/GL}$ are connected to the transfer gate groups 42 and 43, respectively, at one end thereof. The global capacitance CGL and C/GL are shared by a plurality of bit lines and added to a selected bit line. Charges due to a current flowing through a magnetoresistive element in an MRAM cell are stored (charged or discharged) in a capacitor that is a composite of local and global capacitance.

A column selection signal CSL1 selects a transfer gate of the transfer gate group 42, which selects a bit line corresponding to an address to which the processor has made a read request. A column selection signal CSL2 selects a transfer gate of the transfer gate group 43, which selects a bit line corresponding to an address to be prefetched.

A voltage of the bit line selected by the column selection signal CSL1 is sensed by the sense amplifier 4 when a sense enable signal SE1 is high. A voltage of the bit line selected by the column selection signal CSL2 is sensed by the sense amplifier 4 when a sense enable signal SE2 is high.

FIG. 8 is a timing chart for reading from the cache memory 1 using the circuit of FIG. 7 and prefetching using the local buffer 5. When the processor designates an address to make a read request, the column selection signal CSL1 is set to be high (time t1) and then a word line corresponding to the designated address is set to be high (time t2). This initiates current flow to a magnetoresistive element of an MRAM cell corresponding to the designated address (time t3).

Thereafter, when the sense enable signal SE1 is set to be high, data is output from the sense amplifier 4 (time t4 to t5). The data is transferred to the processor.

Subsequently, the cache controller 6 sets the sense enable signal SE1 to high in order to prefetch an address next to the address designated by the processor (time t6) and then sets a word line corresponding to this address to high (time t7). This initiates current flow to a magnetoresistive element of an MRAM cell corresponding to the designated address (time t8).

Thereafter, when the sense enable signal SE2 is set to be high, data is output from the sense amplifier 4 (time t9 to t10). The data is transferred to the local buffer 5.

In the timing chart of FIG. 8, a word line is set to be high when data is read from the cache memory 1 and then another word line is set to be high when data is read again from the cache memory 1 for prefetching. It consumes power to change a word line from low to high, and hence it is desirable to perform a high-setting operation at a time up to prefetching. In order to perform this operation, it is required that an address to which the processor has made an access request and an address to be prefetched are located on the same word line.

In the case where cache lines have 512 bits in unit of data, memory cells of, for example, 512×4=2048 bits are connected to each word line. Therefore, in the case of reading data in 512 bits, it is possible to prefetch data in the remaining one to three units from memory cells connected to the same word line.

Figure 9:
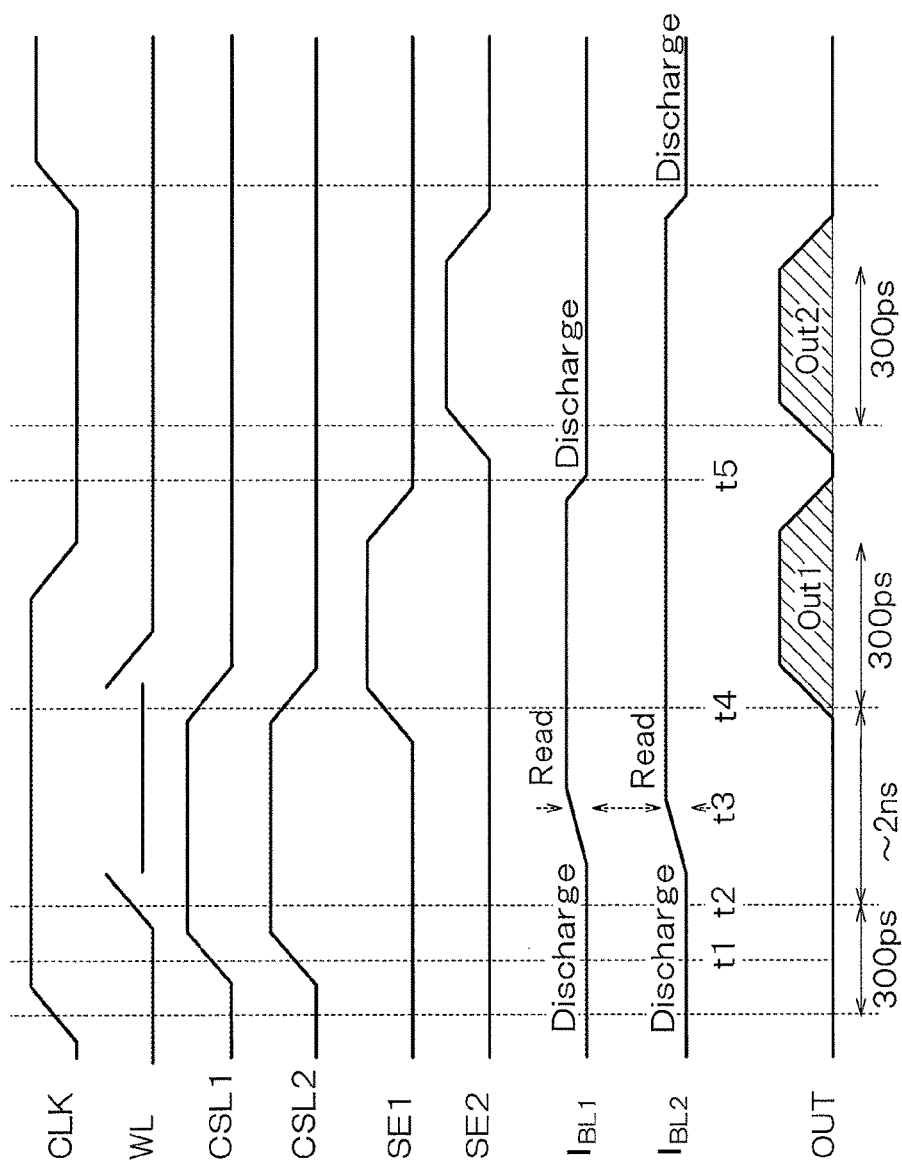
FIG. 9 is a timing chart for data reading from the cache memory 1 and prefetching in a word line one-time high-setting operation.

FIG. 9 is a timing chart for data reading from the cache memory 1 and prefetching, with a word-line high-setting operation at a time. FIG. 9 shows an example in which a word line to which the processor has made a read request and a word line corresponding to an address to be prefetched are the same word line.

At time t1 in FIG. 9, the column selection signals CSL1 and CSL2 are set to be high to discharge in advance the corresponding bit lines for reading (resetting). Subsequently, the corresponding word lines are set to be high. This initiates current flow to both of the magnetoresistive element corresponding to an address to which the processor has made a read request and the magnetoresistive element corresponding to an address to be prefetched, thereby charging the corresponding bit lines (time t3). Conversely, the corresponding bit lines may be charged in advance for reading to make currents flow to the magnetoresistive elements, thereby discharging the bit lines.

Thereafter, at time t4, the sense enable signal SE1 is set to be high so that the sense amplifier 4 senses a voltage of a bit line corresponding to an address to which the processor has made a read request, thereby outputting data. The data is transferred to the processor.

Subsequently, at time t5, the sense enable signal SE2 is set to be high so that the sense amplifier 4 senses a voltage of a bit line corresponding to an address to be prefetched, thereby outputting data. The data is transferred to the local buffer 5.

As described above, in the case where an address to which the processor has made an access request and an address to be prefetched are located on the same word line, once the word line is set to be high, data of these two addresses can be read in succession. This operation reduces the number of times of word line driving, thereby achieving reduction in power consumption and increase in access speed in successive reading.

The same word line implies that the row decoder 3 can reduce the number of times of decoding process to decode addresses to generate word-line selection signals, which also implies that the row decoder 3 can reduce the consumption power.

FIG. 10 is a graph showing a breakdown of power consumption for each read request by the processor. The power consumption includes 1) power consumption by a row selector circuit, or the row decoder 3, and power consumption for word-line driving, 2) power consumption for bit-line driving and by the sense amplifier 4, 3) power consumption by input and output buffers, and 4) power consumption for sub-array driving. Here, the sub-arrays are circuit blocks other than the circuit blocks in 1) to 3) listed above, in the cache memory 1.

The power in 1) of FIG. 10 can be reduced by allocating on the same word line an address to which the processor has made a read request and an address to be prefetched, to reduce the number of times of word-line driving and the number of times of decoding by the row decoder 3. This reduces power required for prefetching by about 30%.

In the above-described embodiment, the internal configuration of the cache memory 1 has been explained. Three-dimensional integration may be realized by connecting a chip having the cache memory 1 built therein and a chip having a built-in processor through TSV (Through Silicon Via).

FIG. 11 is a schematic layout diagram showing an example of three-dimensional integration. In FIG. 11, a chip 51 having the components of the cache memory 1 of FIG. 1 built therein and a chip 52 having the processor and its peripheral circuits built therein are connected to each other through TSVs 53 and 54. The components built in the chip 52 are a multi-core processor 55, a first-level cache memory 56 having an instruction cache and a data cache, a memory controller 57, and a streaming buffer 58. The streaming buffer 58 stores prefetched data.

Either of the two chips 51 and 52 may be provided above the other. Moreover, a part of the circuit blocks in each chip may be built in another chip.

As described above, in the present embodiment, the small-capacity and high-speed local buffer 5 is provided in addition to the cache memory 1. When the processor makes a read request to the cache memory 1, data of an address that is different from the address to which the read request has been made is prefetched from the cache memory 1 and then stored in the local buffer 5. Therefore, when the processor makes a read request thereafter, if the address to which the read request has been made is stored in the local buffer 5, data can be read from the local buffer 5 at a higher speed than from the cache memory 1.

Moreover, by allocating on the same word line an address to which the processor has made a read request and an address to be prefetched, prefetching is achieved without increasing the number of times of word-line driving and the number of times of decoding by the row decoder 3, thereby reducing power consumption.

The present invention is not limited to the embodiments described above but includes various modifications conceivable by those skilled in the art. The effects of the present invention are also not limited to those described above. Namely, various additions, modifications and partial omissions may be made without departing from the conceptual idea and gist of present invention derived from those defined in the accompanying claims and their equivalents.

The invention claimed is:

1. A memory control circuit to control a first memory comprising a plurality of MRAM (Magnetoresistive Random Access Memory) cells, each MRAM cell including a magnetoresistive element to store data, comprising:
   a second memory, when there is a read request to a first address of the first memory, to store data of a second address read out from the first memory, the second address being different from the first address;
   a controller to control access to the first memory and the second memory;
   a capacitor connected in series to the magnetoresistive element; and
   a sense amplifier to sense a logic of the data from a voltage between both electrodes of the capacitor, the voltage varying in accordance with a current flowing through the magnetoresistive element,
   wherein the second memory has a smaller capacity than the first memory and is accessible at a higher speed than the first memory, and stores a part of data stored in the first memory.

2. The memory control circuit of claim 1, wherein the second memory comprises a smaller number of MRAM cells than the first memory.

3. The memory control circuit of claim 1, wherein the controller makes currents flow through a magnetoresistive element in an MRAM cell corresponding to the first address and a magnetoresistive element in an MRAM cell corresponding to a second address different from the first address, to charge or discharge the capacitor that corresponds to each of the magnetoresistive elements.

4. The memory control circuit of claim 3, wherein the controller sends an enable signal for reading a voltage between both electrodes of the capacitor corresponding to the first address and an enable signal for reading a voltage between both electrodes of the capacitor corresponding to the second address, to the sense amplifier in succession, to read data in succession.

5. The memory control circuit of claim 1, wherein the capacitor comprises:
a first capacitor provided per bit line; and
a second capacitor provided per group of a plurality of bit lines, the second capacitor being connected to a bit line selected among the plurality of bit lines.

6. The memory control circuit of claim 5 comprising:
a plurality of bit lines that are provided per group of a plurality of MRAM cells aligned in a first direction and that are aligned in a second direction that intersects with the first direction;
a plurality of word lines that are provided per group of a plurality of MRAM cells aligned in the second direction and that are aligned in the first direction; and
a bit-line selector circuit to select one from among the plurality of bit lines,
wherein the second capacitor is connected to a bit line selected by the bit-line selector.

7. The memory control circuit of claim 5, wherein the second address include an address selected by a word line corresponding to the first address,
wherein the bit-line selector circuit comprises:
a first bit-line selector circuit to select a bit line corresponding to the first address; and
a second bit-line selector circuit to select a bit line corresponding to the second address,
wherein the second capacitor is provided for each of the first bit-line selector circuit and the second bit-line selector circuits.

8. The memory control circuit of claim 1, wherein when the controller receives a third address for a read request different from the first address by a processor, the controller suspends a process of reading data of the second address from the first memory and of storing the data in the second memory.

9. The memory control circuit of claim 1, wherein the controller determines the second address based on history information of addresses of read requests by a processor.

10. The memory control circuit of claim 1, wherein, after data corresponding to the second address is stored in the second memory, when a probability of making a read request to the second address by a processor is smaller than a predetermined threshold value, the controller suspends a process of reading data of the second address from the first memory to store the data in the second memory.

11. The memory control circuit of claim 1 further comprising an FPGA (Field Programmable Gate Array) that is capable of reprogramming later an algorithm for setting the second address.

12. The memory control circuit of claim 1, wherein the second address corresponding to data to be stored in the second memory includes at least an address next to the first address.

13. The memory control circuit of claim 1, wherein the second memory has a cell structure identical to a cell structure of the first memory.

14. A memory control circuit to control a first memory, comprising:

a second memory, when there is a read request to a first address of the first memory, to store data of a second address read out from the first memory, the second address being different from the first address, and the second address being an address without the read request; and
a controller to control access to the first memory and the second memory,
wherein the second memory has a smaller capacity than the first memory and is accessible at a higher speed than the first memory, and stores a part of data stored in the first memory without storing data of the first address, and
the second address has an address selected by a word line corresponding to the first address.

15. A cache memory, comprising:
a first memory comprising a plurality of MRAM (Magnetoresistive Random Access Memory) cells, each MRAM cell including a magnetoresistive element to store data;
a second memory, when there is a read request to a first address of the first memory, to store data of a second address read out from the first memory, the second address being different from the first address;
a controller to control access to the first memory and the second memory;
a capacitor connected in series to the magnetoresistive element; and
a sense amplifier to sense a logic of the data from a voltage between both electrodes of the capacitor, the voltage varying in accordance with a current flowing through the magnetoresistive element,
wherein the second memory has a smaller capacity than the first memory and is accessible at a higher speed than the first memory, and stores of a part of data stored in the first memory.

16. The cache memory of claim 15, wherein the controller makes currents flow through a magnetoresistive element in an MRAM cell corresponding to the first address and a magnetoresistive element in an MRAM cell corresponding to a second address different from the first address, to charge or discharge the capacitor that corresponds to each of the magnetoresistive elements.

17. The cache memory of claim 16, wherein the controller sends an enable signal for reading a voltage between both electrodes of the capacitor corresponding to the first address and an enable signal for reading a voltage between both electrodes of the capacitor corresponding to the second address, to the sense amplifier in succession, to read data in succession.

18. The cache memory of claim 15, wherein the capacitor comprises:
a first capacitor provided per bit line; and
a second capacitor provided per group of a plurality of bit lines, the second capacitor being connected to a bit line selected among the plurality of bit lines.

19. The cache memory of claim 18 comprising:
a plurality of bit lines that are provided per group of a plurality of MRAM cells aligned in a first direction and that are aligned in a second direction that intersects with the first direction;
a plurality of word lines that are provided per group of a plurality of MRAM cells aligned in the second direction and that are aligned in the first direction; and
a bit-line selector circuit to select one from among the plurality of bit lines, wherein the second capacitor is connected to a bit line selected by the bit-line selector.

20. The cache memory of claim 18, wherein the second address include an address selected by a word line corresponding to the first address,
wherein the bit-line selector circuit comprises:
a first bit-line selector circuit to select a bit line corresponding to the first address; and
a second bit-line selector circuit to select a bit line corresponding to the second address,
wherein the second capacitor is connected to each of the first bit-line selector circuit and the second bit-line selector circuits.

* * * * *